US011289945B2

(12) United States Patent
Meynardi et al.

(10) Patent No.: US 11,289,945 B2
(45) **Date of Patent: *Mar. 29, 2022**

(54) REMOTE POWER OUTAGE AND RESTORATION NOTIFICATION

(71) Applicant: Verizon Patent and Licensing Inc., Arlington, VA (US)

(72) Inventors: Alessandro M. Meynardi, Macungie, PA (US); Jean F. Dubois, Boothbay Harbor, ME (US); Martin Doehring, Northborough, MA (US); C. P. Cheng, Lexington, MA (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/537,737

(22) Filed: Aug. 12, 2019

(65) Prior Publication Data

US 2019/0363574 A1 Nov. 28, 2019

Related U.S. Application Data

(63) Continuation of application No. 12/915,998, filed on Oct. 29, 2010, now Pat. No. 10,381,869.

(51) Int. Cl.
*H02J 13/00* (2006.01)
*G01R 31/08* (2020.01)

(52) U.S. Cl.
CPC ........ *H02J 13/0006* (2013.01); *G01R 31/085* (2013.01)

(58) Field of Classification Search
CPC ....... H02J 13/0006; G01R 31/085; G06F 1/30
USPC ....... 702/58, 59, 60–62, 182, 183, 185, 188, 702/189
See application file for complete search history.

(56) References Cited

U.S. PATENT DOCUMENTS 5,568,399 A * 10/1996 Sumic .................. G01R 31/086 700/293
5,946,373 A * 8/1999 Harris ................. H04M 3/2254 379/14.01
7,395,444 B2 7/2008 Ives
7,542,428 B1 6/2009 Johnson et al.
10,381,869 B2 * 8/2019 Meynardi ......... H02J 13/00017
(Continued)

OTHER PUBLICATIONS

Definition of exceed, Dictionary.com, printed Mar. 30, 2021. (Year: 2021).*

*Primary Examiner* — Michael P Nghiem

(57) ABSTRACT

Power outages and restorations at customer premises can be automatically detected and reported. A method may include receiving, from a network terminal, a first notification associated with a power outage; retrieving location information associated with the network terminal; sending a second notification indicating that the outage has occurred and that includes the location information associated with the network terminal; retrieving prior outage information that corresponds to a set of network terminals associated with a group of set top boxes; determining that an outage event is triggered, when a quantity of outages is greater than a threshold, where the quantity of outages is based on the outage and other outages obtained from the prior outage information; and sending a third notification based on the determination that the outage event is triggered.

20 Claims, 6 Drawing Sheets

(56) References Cited

U.S. PATENT DOCUMENTS

| | | | | |
|---|---|---|---|---|
| 2004/0258035 | A1* | 12/2004 | Fan | H04W 16/14 370/342 |
| 2005/0125552 | A1 | 6/2005 | Katayama | |
| 2006/0168191 | A1* | 7/2006 | Ives | G06F 1/30 709/224 |
| 2008/0244067 | A1 | 10/2008 | Ushiyama | |
| 2009/0184835 | A1* | 7/2009 | Deaver, Sr. | H02J 13/0062 340/660 |
| 2009/0187285 | A1 | 7/2009 | Yaney et al. | |
| 2011/0218686 | A1 | 9/2011 | McHann et al. | |
| 2012/0008509 | A1* | 1/2012 | Myers | H04W 24/06 370/252 |
| 2012/0109545 | A1 | 5/2012 | Meynardi et al. | |
| 2013/0138367 | A1* | 5/2013 | Boivin | G01R 31/08 702/59 |
| 2013/0257623 | A1* | 10/2013 | Bagasra | G01D 4/004 340/657 |
| 2013/0324111 | A1* | 12/2013 | Tontinuttanon | H04L 41/147 455/424 |

* cited by examiner

400

| | NETWORK TERMINAL ID 405 | LOCATION 410 | NOTIFICATION CODE 415 | TIME 420 | OUTAGE DURATION 425 | STATUS 430 |
|---|---|---|---|---|---|---|
| 435 | Device ID | Address 1 | A1 | 10/01/10 11:11:35 | 00:02:05 | Battery - Full |
| 440 | Network address | Coordinates x, y | A2 | 10/01/10 08:41:38 | 02:29:30 | AC |
| | ⋮ | | ⋮ | | ⋮ | |

| | AREA ID 505 | QUANTITY OF OUTAGES 510 | OUTAGE THRESHOLD 515 | SIMULTANEOUS OUTAGES 520 | CO-LOCATED OUTAGES 525 |
|---|---|---|---|---|---|
| 530 | A1 | A1-X | THA1 | A1-Y | A1-Z |
| 535 | B1 | B1-X | THB1 | B1-Y | B1-Z |
| | . . . | | . . . | | . . . |
| 540 | REGION 1 | TOTAL 1 | TH1 | TOT-Y | TOT-Z |

FIG. 5

REMOTE POWER OUTAGE AND RESTORATION NOTIFICATION

RELATED APPLICATION

This application is a continuation of application Ser. No. 12/915,998 filed Oct. 29, 2010, now U.S. Pat. No. 10,381,869, the contents of which are hereby incorporated by reference herein.

BACKGROUND

Electrical power is transmitted via a power grid that includes a network of transmission lines, power generation stations, substations, etc., to residential, commercial and/or industrial customers. Occasionally, the power that is transmitted via the power grid may be disrupted, which may cause a power outage to occur that affects one or more customers. Power outages may be caused by inclement weather, a manmade event (e.g., a cut transmission line due to construction), equipment malfunctions, etc.

Power providers (e.g., utilities, power utilities, cooperatives, etc.) usually respond to an outage in a reactive manner based on calls received from customers indicating that power has been lost and/or calls received from local, state or federal first responders associated with an incident potentially affecting the power grid (e.g., a vehicle hitting an electric pole, etc.). When an outage is identified, power providers initiate outage management processes and/or systems to manage and restore the outage. Generally, restoration of service is confirmed based on calls to and/or from customers in areas affected by the outage and/or based on physical inspections by field force personnel. Unfortunately, power providers may experience delay when detecting an outage, isolating a cause of the outage, restoring power in response to the outage, and/or confirming that power has been restored when calls are not received from customers and/or when relying on maintenance crews to perform the physical inspections.

BRIEF DESCRIPTION OF THE DRAWINGS

FIG. 4 is a diagram of an example outage notification data structure according to an implementation described herein;

FIG. 5 is a diagram of an example outage event data structure according to an implementation described herein.

DETAILED DESCRIPTION OF PREFERRED EMBODIMENTS

Figure 1:
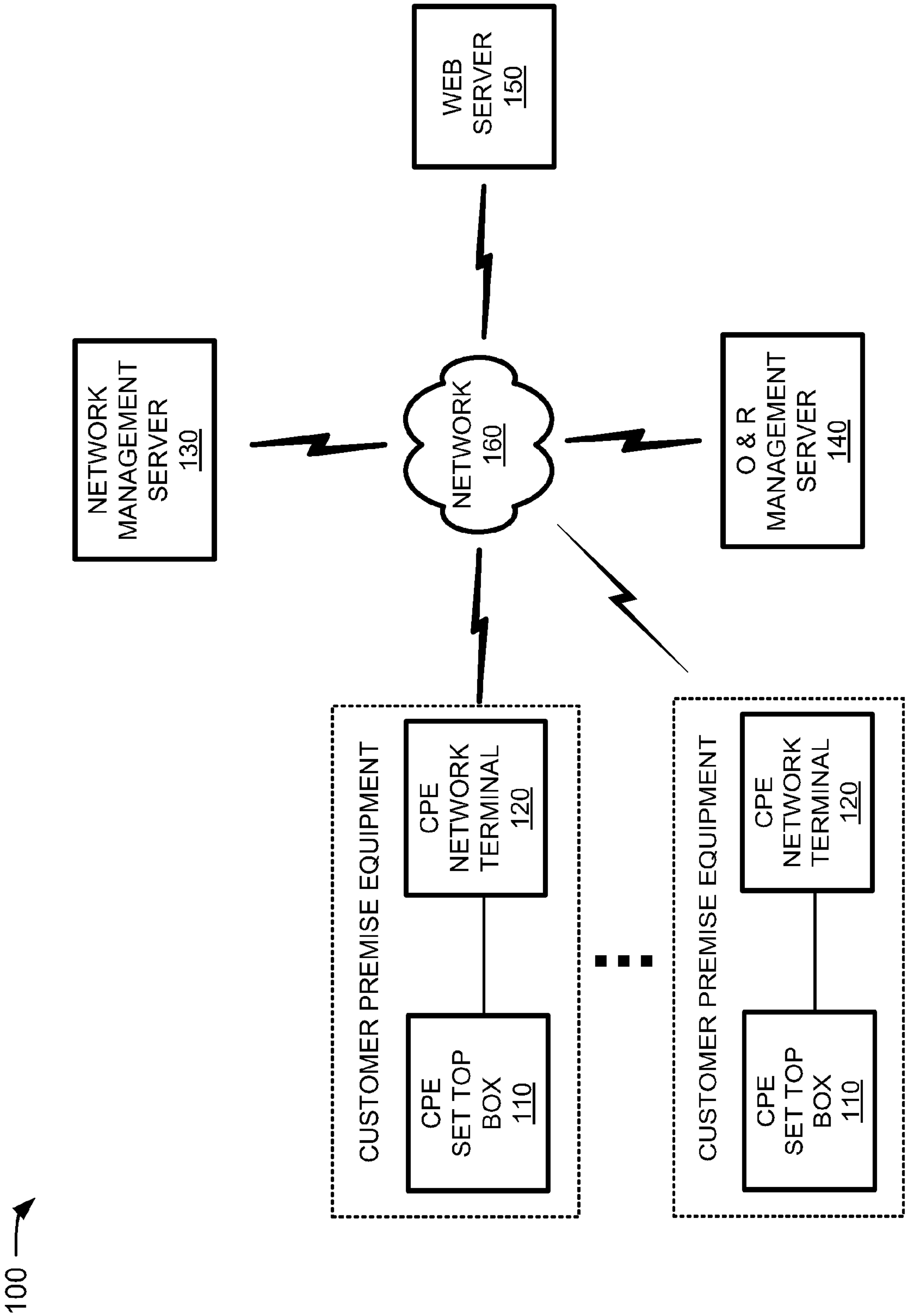
FIG. 1 is a diagram of an example network in which systems and/or methods described herein may be implemented.

The following detailed description refers to the accompanying drawings. The same reference numbers in different drawings may identify the same or similar elements. Also, the following detailed description does not limit the invention.

An implementation, described herein, may include systems and/or methods that provide for remote power outage and restoration notification using an outage and restoration notification application (hereinafter referred to as "O & R application") that enables an outage and/or restoration, associated with a customer premise, to be remotely detected, located, and/or reported to a power provider (e.g., a power utility, a utility, and/or any entity that provides electrical power). As described herein, the O&R application may detect a power outage and/or restoration (e.g., when power is restored) when customer premises' equipment, such as a network terminal (e.g., via which a set top box receives traffic from a network), sends an outage alert and/or restoration alert, respectively, to a network management server on which the O&R application is hosted. The network management server may detect the outage and/or restoration (e.g., based on the alerts) and may notify the power provider by sending an outage notification and/or a restoration notification, respectively to the power provider. Remotely detecting, locating, and/or reporting the outage and/or restoration may reduce operations and/or maintenance costs incurred by the power provider during outage restoration activities by reducing an amount of time and/or expense associated with detecting the outage, locating a source of the outage, and/or restoring power in response to the outage.

Alternatively, or additionally, the O&R application may determine whether an outage event has been triggered based on information associated with one or more outages that have occurred within a geographical territory and/or region. The term "outage event," as described herein, may include a quantity of outages (e.g., that exceeds a threshold) within a geographic area, a quantity of simultaneous outages (e.g., that occur within a period of time relative to other outages) within the geographic area, a quantity of co-located outages (e.g., that occur within a particular distance relative to each other) within the geographic area, and/or an event notification that is received from authorities, such as local, state, and/or federal governmental authorities and/or first responders. Detection of an outage event may indicate that a condition and/or pattern of outages, associated with a power grid, exists that may cause and/or be associated with wide spread effects on the power grid as compared to isolated and/or individual outages. If an outage event has been triggered, the O&R application may send information associated with the outage event to the power provider, which may enable the power provider to proactively respond to the outage event in order to remedy and/or mitigate effects of the outage event. In the event of an outage, the power provider may, for example, perform acts (e.g., load balancing, proactive shutdowns, etc.) that may mitigate the effects of the outage event by reducing a quantity of affected customers (e.g., customers associated with customer premises equipment), a geographic extent of the outage event, potential damage to the power grid, etc.

The O&R application may determine whether an outage event has been remedied based on information associated with one or more restorations that have occurred within a geographical territory and/or region. A restoration occurs when power is restored to a customer that has experienced an outage and a restoration alert is received from customer premises equipment associated with the outage. The outage event may be remedied when a quantity of restoration alerts, received from customer premises equipment, indicates that the quantity of outages has decreased to a level that is less than the threshold.

FIG. 1 is a diagram of an example network 100 in which systems and/or methods described herein may be implemented. As illustrated in FIG. 1, network 100 may include one or more customer premises equipment (CPE) set top box (STB) 110 (hereinafter referred to as "STB 110"), one or more customer premise equipment (CPE) network terminal 120 (hereinafter referred to as "network terminal 120"), a network management server (NMS) 130, an outage and restoration (O&R) management server (OMS) 140 (hereinafter referred to as "O&RS 140"), and an information server 150 that are interconnected via a network 160. The number of devices and/or networks, illustrated in FIG. 1, is provided for explanatory purposes only. In practice, there may be additional devices and/or networks, fewer devices and/or networks, different devices and/or networks, or differently arranged devices and/or networks than illustrated in FIG. 1.

Also, in some implementations, one or more of the devices of network 100 may perform one or more functions described as being performed by another one or more of the devices of network 100. For example, STB 110 and network terminal 120 may be integrated into a single device. In another example, NMS 130 and O&RS 140 may be integrated into a single device. Devices of network 100 may interconnect via wired connections, wireless connections, or a combination of wired and wireless connections.

STB 110 may include a one or more devices that can receive and process an enhanced media stream and/or other traffic (e.g., Internet Protocol (IP)-based traffic), received from network 160 via network terminal 120, for display on a video display device associated with STB 110. In one example implementation, STB 110 may be incorporated directly within a video display device (e.g., a television, a monitor, etc.). In another example implementation, STB 110 may be replaced with a computing device (e.g., a personal computer, a laptop computer, a tablet computer, etc.), a cable card, a TV tuner card, or a portable communication device (e.g., a mobile telephone or a PDA). STB 110 may perform decoding and/or decryption functions on the enhanced media stream. STB 110 may be associated with customer premise equipment that is located within a facility (e.g., a business, a residence, etc.) associated with a user of STB 110.

Network terminal 120 may include one or more computation or communication devices that are capable of communicating with network 160 and/or STB 110. For example, network terminal 120 may include a device that can receive and/or process an enhanced media stream and/or other traffic (e.g., Internet Protocol (IP)-based traffic), received from network 160, to be presented to one or more STBs 110 for display. Network terminal 120 may be associated with customer premise equipment that is located within a facility (e.g., a business, a residence, etc.) associated with a user of STB 110.

Network terminal 120 may send an alert to network 160 that indicates a power state associated with network terminal 120. For example, network terminal 120 may detect that electrical power is no longer being received from an alternating current (AC) power source (e.g., via an AC power outlet connected to a power grid). Network terminal 120 may, based on the detection that AC power is no longer being received, send an outage alert which indicates that network terminal 120 is no longer receiving electrical power from the AC power source. In another example, the outage alert may identify whether network terminal 120 is operating using electrical power being received from a direct current (DC) power source (e.g., from a storage device such as a battery) and/or may identify available capacity of a DC power source associated with network terminal 120 (e.g., fully charged, partially charged, last gasp charge, etc.). In yet another example, network terminal 120 may detect that electrical power from the AC power source has been restored and may send a restore alert, which may indicate that electrical power from the AC power source has been restored. In general, network terminal 120 may thus operate from power received from the power grid. If the power from the grid fails, network terminal 120 may begin to operate from its backup battery power. The outage alert may be transmitted when network terminal 120 switches from grid power to backup power. Conversely, a restoration alert may be transmitted when network terminal 120 switches from backup power to grid power.

NMS 130 may include one or more server devices, or other types of computation or communication devices, that gather, process, search, store, and/or provide information in a manner similar to that described herein. For example, NMS 130 may include a server device that stores software or logic associated with an O&R application that performs operations associated with remote power outage detection and restoration. NMS 130 may detect, retrieve, and/or process alerts received from network terminal 120 in order to detect an outage, determine that an outage event has occurred, isolate faults and/or locations associated with an outage, and/or detect when power has been restored and/or an outage event has been remedied.

In one example implementation, NMS 130 may detect a power outage and may report the outage to a server device associated with a power provider. For example, NMS 130 may receive, from network terminal 120, an outage alert indicating that the network terminal 120 is operating on battery power (e.g., instead of electrical power from a power grid). The outage notification may include information associated with network terminal 120 (e.g., a device identifier, a network address, etc.) and/or a power state associated with network terminal 120 (e.g., operating on battery power, remaining battery capacity, a time period before the battery is dead, etc.). The O&R application may record a time associated with the receipt of outage alert and may determine a location (e.g., such as a physical address, coordinates, etc.) that corresponds to the information associated with network terminal 120 (e.g., based on a look-up operation). NMS 130 may send an alert notification to O&RS 140 reporting the outage, which may include information associated with the outage. The information associated with the outage may include the recorded time, the location information, and/or information associated with network terminal 120.

In another example, the O&R application may determine whether an outage event has occurred. For example, the O&R application may store the information associated with the outage in an outage event data structure that includes information associated with other outages detected within a geographical area. The O&R application may, in one example, determine that an outage event has occurred when a quantity of outages (e.g., based on the outage and the other outages) is greater than a threshold. In another example, the O&R application may determine that an outage event has been detected when the outage occurred at approximately the same point in time (e.g., simultaneously) as one or more other outages. In yet another example, the O&R application may determine that an outage event has been detected when the outage occurred at approximately the same location (e.g., within a particular proximity, distance, radius, etc.) as one or more other outages. In still another example, the O&R application may identify outage patterns based on location, timing, and/or quantity of outages relative to the components associated with the power grid (e.g., such as substations, transmission lines, etc.), which may permit faults (e.g., transmission line breaks, equipment failures, etc.) to be located and/or isolated. Based on a determination that an outage event has occurred, NMS 130 may send an outage event notification to O&RS 140 to report that the outage event may have been detected.

NMS 130 may provide outage updates and/or identify when an outage and/or outage event has been remedied. For example, NMS 130 may receive a restoration alert from network terminal 120 when power has been restored to network terminal 120. O&R application may process the restoration alert and may provide a restoration notification to O&RS 140 indicating that an outage, associated with network terminal 120 (e.g., at a particular location, address, etc.), has been remedied. In another example, the O&R application may provide an outage event update notification that identifies a quantity of outages and/or restorations, locations of outages and/or restorations, and/or trends associated with outages and/or restorations (e.g., whether the quantity of outages are increasing, decreasing, etc.). The O&R application may send a customer notification to network terminal 120 indicating that the outage alert has been received and/or that the power has been restored, etc.

O&RS 140 may include one or more server devices, or other types of computation or communication devices, that gather, process, search, store, and/or provide information in a manner similar to that described herein. In an example implementation, O&RS may include a provider gateway device that may communicate with network 160 and/or one or more NMS 130 on behalf of O&RS 140. O&RS 140 may perform operations associated outages, outage events, restorations, communications and/or reporting activities associated with public utility commissions, public service commissions, and/or governmental authorities (e.g., local, state, federal authorities, etc.).

O&RS 140 may, for example, receive an outage notification from NMS 130 indicating that an outage has occurred at a particular location (e.g., based on information associated with an address, location, etc.) within a geographic region. O&RS 140 may, in response to the outage notification, perform operations to isolate a fault associated with the outage, restore power to network terminal 120 associated with the outage, and/or cause a maintenance action to be implemented to investigate and/or remedy the outage. In another example, O&RS 140 may receive an outage event notification from NMS 130 indicating that an outage event has been detected by NMS 130 (e.g., based on a quantity of outage alerts received from network terminals 120). O&RS 140 may, in response to the outage notification, perform operations to isolate a fault associated with the outage event, restore power to all or a portion of terminal devices 120 associated with the outage event, and/or cause a maintenance action to be implemented to investigate and/or remedy outages associated with the outage event.

In an example implementation, O&RS 140 may present location information (e.g., obtained from the outage notification and/or outage event notification) for display via a user interface (UI). The UI may indicate one or more locations, within a geographical area and/or the power grid architecture, at which one or more outages have been detected by NMS 130. O&RS 140 may send information to maintenance teams that may enable the maintenance team to remedy the outage. The information, obtained from the outage notification and/or outage event notification, may include a time associated with the outage, an approximate location of the outage, etc. For example, the O&RS 140 may use the information associated with the outage to isolate faults within the power grid and/or cause power to be switched or rerouted via transmission paths that do not contain faults. In another example, O&RS 140 may send a notification to government authorities when an outage event may be associated with a national security matter and/or man made or natural disaster (e.g., when a quantity of outages exceed a particular threshold, etc.).

In yet another example, O&RS 140 may receive a restoration notification, from NMS 130, indicating that power has been restored to a particular network terminal 120 and/or at a location associated with network terminal 120 (e.g., based on information associated with an address, location, etc.) within a geographic region. O&RS 140 may update an outage status associated with the power grid and/or determine a rate at which outages are increasing and/or decreasing based on the restoration notification. O&RS 140 may, in response to the restoration notification, determine that an outage event has been mitigated and/or remedied. O&RS 140 may send a notification, to public utility commission, a public service commission, governmental authorities, etc., indicating that the outage event has been mitigated and/or remedied. The notification may include information associated with a duration of an outage, a response time associated with an outage notification, a duration associated with an outage event, a quantity of outages detected, information associated with a cause of the outage, etc.

Information server 150 may include one or more server devices, or other types of computation or communication devices, that gather, process, search, store, and/or provide information in a manner similar to that described herein. For example, information server 150 may correspond to a local, state, and/or federal authority from which information associated with weather, natural disasters, national security incidents, and/or conditions associated with a national power grid, which may affect the power grid associated with O&RS 140. For example, information server 150 may generate and/or send notifications associated with inclement weather which may NMS 130 and/or O&RS 140 may use to forecast and/or notify outages. In another example, information server 150 may provide information associated with weather forecasts, historical weather information, and/or historical data associated with energy consumption and/or outages.

Network 160 may include one or more wired and/or wireless networks. For example, network 160 may be include a cellular network, the Public Land Mobile Network (PLMN), and/or a second generation (2G), a third generation (3G), a fourth generation (4G), a fifth generation (5G) and/or another network. Additionally, or alternatively, network 160 may include a wide area network (WAN), a metropolitan area network (MAN), a telephone network (e.g., the Public Switched Telephone Network (PSTN)), an ad hoc network, an intranet, the Internet, a fiber optic-based network (e.g., a fiber optic service (FiOS) network), and/or a combination of these or other types of networks.

Figure 2:
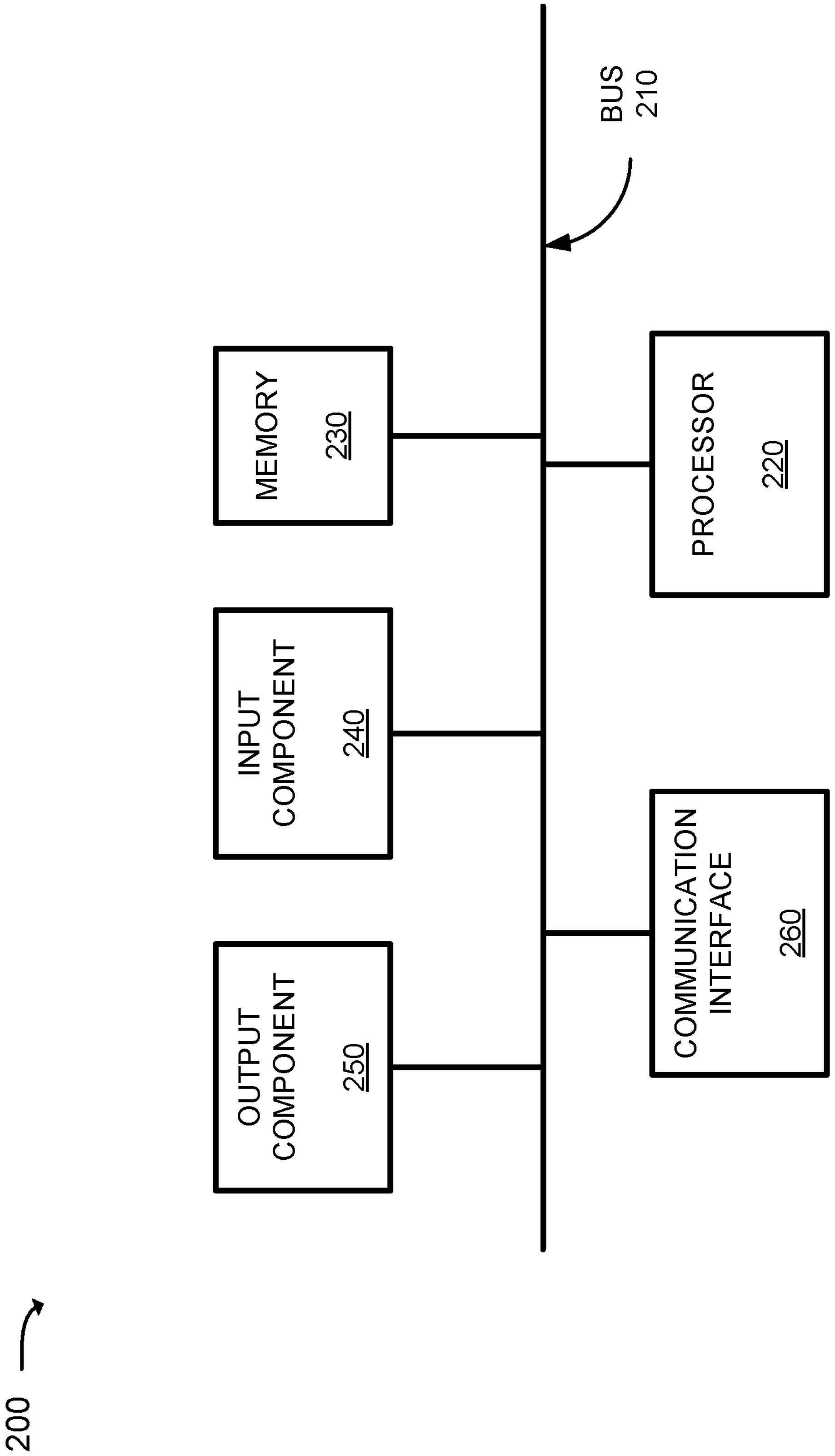
FIG. 2 is a diagram of example components of one or more of the devices of FIG. 1.

FIG. 2 is a diagram of example components of a device 200. Device 200 may correspond to STB 110, processor 326 (e.g., described below in FIG. 3), NMS 130, O&RS 140, and/or information server 150. Alternatively, STB 110, processor 326, NMS 130, O&RS 140, and/or information server 150 may include one or more devices 200. Device 200 may include a bus 210, a processor 220, a memory 230, an input component 240, an output component 250, and a communication interface 260. Although FIG. 2 shows example components of device 200, in other implementations, device 200 may contain fewer components, additional components, different components, or differently arranged components than depicted in FIG. 2. Additionally, or alternatively, one or more components of device 200 may perform one or more tasks described as being performed by one or more other components of device 200.

Bus 210 may include a path that permits communication among the components of device 200. Processor 220 may include a processor, microprocessor, or processing logic that may interpret and execute instructions. Memory 230 may include any type of dynamic storage device that may store information and instructions, for execution by processor 220, and/or any type of non-volatile storage device that may store information for use by processor 220.

Input component 240 may include a mechanism that permits a user to input information to device 200, such as a keyboard, a keypad, a button, a switch, etc. Output component 250 may include a mechanism that outputs information to the user, such as a display, a speaker, one or more light emitting diodes (LEDs), etc. Communication interface 260 may include any transceiver-like mechanism that enables device 200 to communicate with other devices and/or systems via wireless communications (e.g., radio frequency, infrared, and/or visual optics, etc.), wired communications (e.g., conductive wire, twisted pair cable, coaxial cable, transmission line, fiber optic cable, and/or waveguide, etc.), or a combination of wireless and wired communications. For example, communication interface 260 may include mechanisms for communicating with another device or system via a network, such as network 160.

As will be described in detail below, device 200 may perform certain operations relating to remote power outage & restoration notification. Device 200 may perform these operations in response to processor 220 executing software instructions contained in a computer-readable medium, such as memory 230. A computer-readable medium may be defined as non-transitory memory device. A memory device may include a space within a single physical memory device or spread across multiple physical memory devices. The software instructions may be read into memory 230 from another computer-readable medium or from another device. The software instructions may be read into memory 230 from another computer-readable medium or from another device. The software instructions contained in memory 230 may cause processor 220 to perform processes described herein. Alternatively, hardwired circuitry may be used in place of or in combination with software instructions to implement processes described herein. Thus, implementations described herein are not limited to any specific combination of hardware circuitry and software.

Figure 3:
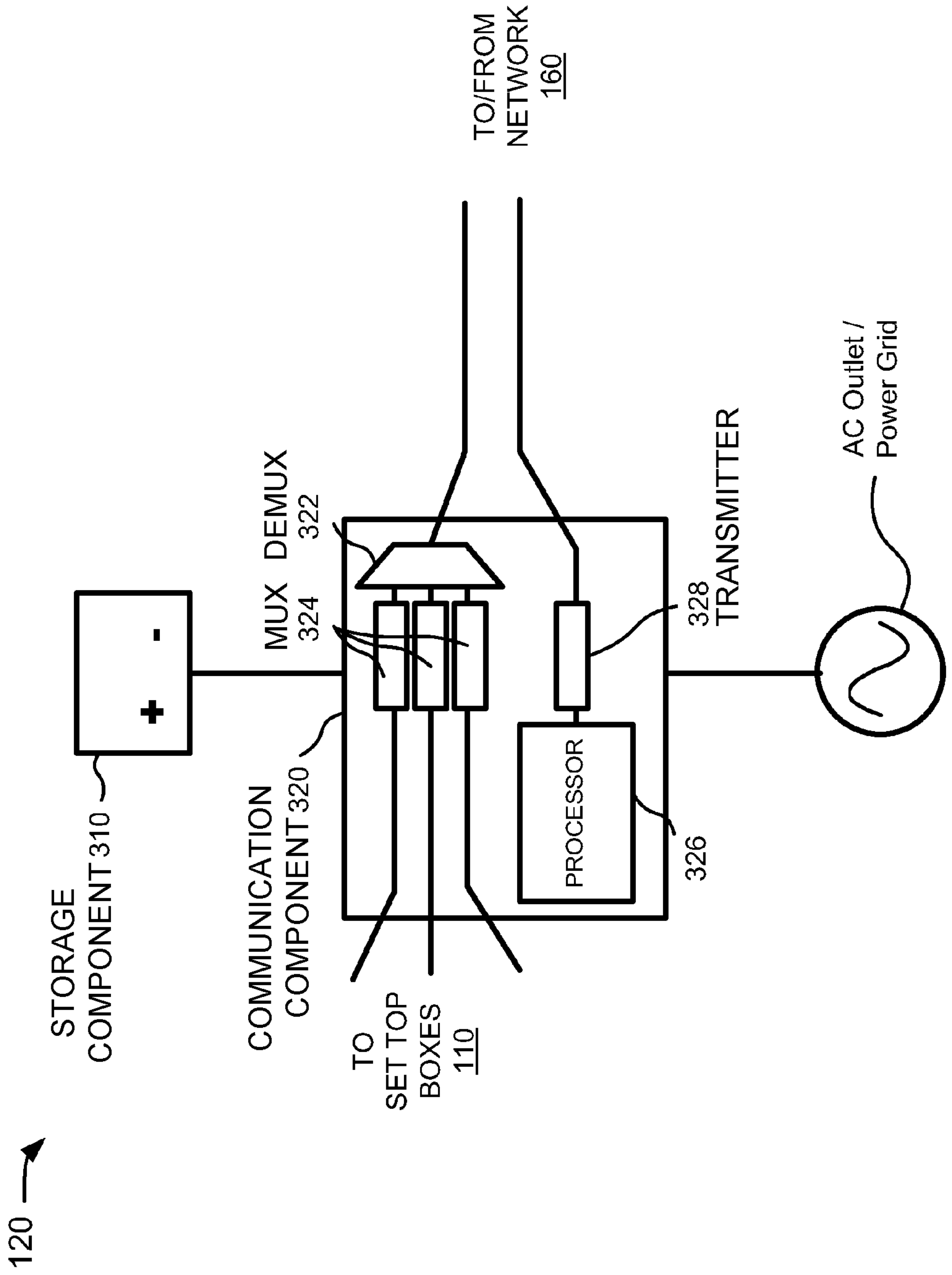
FIG. 3 is a diagram of example components of a network terminal device of FIG. 1.

FIG. 3 is a diagram of example functional components that may be associated with network terminal 120. As illustrated, network terminal 120 may include a storage component 310 and a communication component 320. The functional components, illustrated in FIG. 3, are provided for explanatory purposes only. In practice, network terminal 120 may include fewer functional components, additional functional components, different functional components, or differently arranged functional components than are described with respect to FIG. 3. Additionally, one or more functional components in FIG. 3 may perform one or more functions described as being performed by another one or more of the functional components of FIG. 3. Also, the functional components in FIG. 3 may be implemented using one or more of the components of device 200 (FIG. 2), such as processor 220.

Storage component 310 may include one or more devices that can store electrical power. In an example implementation, storage component 310 may be a battery that is capable of storing electrical power for use by network terminal 120. For example, during an outage (e.g., when AC power from a power grid is disrupted), network terminal 120 may continue to operate for a period of time (e.g., 1 hour, 4 hours, 8, hours, 12 hours, etc.) using the electrical power stored in storage component 310. Network terminal 120 may rely on storage device 310 to continue to operate until the outage is remedied (e.g., when AC power is restored) or until the stored power, within storage component 310, dissipates (e.g., when a quantity of charge is less than a threshold). Storage component 310 may be charged when the AC power is restored.

Communication component 320 may permit network terminal 120 to communicate with network 160 and/or STB 110 and may be connected to power sources (e.g., storage component 310 and/or an AC outlet via which AC power is received from a power grid). Communication component 320 may include a demultiplexer 322, a multiplexer 324, and/or a processor 326. Demultiplexer 322 may include a device that receives an incoming signal comprising multiple wavelengths and spatially separates the component wavelengths of the received signal, such that there are a number of separate outgoing signals at each component wavelength. In one example implementation, demultiplexer 322 may receive a multi-wavelength optical signal from network 160 and may send outgoing signals, at component wavelengths, to receivers 324. In another example implementation, demultiplexer 322 may receive a multi-wavelength radio frequency (RF) signal from network 160 and may send outgoing signals, at component wavelengths, to receivers 324.

Receiver 324 may include one or more devices that receive an incoming signal and use the incoming signal to generate an outgoing modulated signal. In one example implementation, receiver 324 may be a charged coupled device and/or photodetector, In another example implementation receiver 324 may be a device that receives wired and/or wireless signals. In one example implementation, a bank of receivers 324 may receive a number of incoming signals from demultiplexer 322 and may generate corresponding modulated signals (e.g., video, voice, data, etc.) for transmission to one or more STBs 110 or telephone lines.

Processor 326 may include a processor, a microprocessor, or some form of hardware logic (e.g., an application specific integrated circuit (ASIC) or a Field Programmable Gate Array (FPGA)). In one example implementation, processor 326 may control the manner in which network terminal 120 receives power. For example, in a default mode, processor 326 may cause network terminal 120 to operate based on electrical power (e.g., AC power) received, via an A/C outlet from a power grid. Processor 326 may monitor that state of charge associated with storage component 310 and may cause a portion of the AC power to be used to charge storage device 310. Processor 326 may detect when AC power is no longer being received and may cause communication component 320 to begin receiving power form storage component 310. Based on the detection that AC power is no longer being received, processor 326 may send an outage alert, via transmitter 328 and to NMS 130, indicating that a potential outage has occurred. The outage alert may include an indicator associated with an outage, a time associated with the outage, a state of charge associated with storage device 310, and/or information associated with network terminal 120 (e.g., a device identifier, an network address, etc.).

Processor 326 may detect when AC power has been restored and may cause communication component 320 to begin receiving power from the AC outlet (or from a DC transformer connected to the AC outlet). Based on the detection that AC power has been restored, processor 326 may send a restore notification, via transmitter 328, to NMS 130, which may indicate that the potential outage has been remedied. The restore notification may include an indicator that AC power has been restored, a time that the AC power was restored, a state of charge associated with storage device 310, and/or information associated with network terminal 120. Processor 326 may send a status message (e.g., periodically, at particular times of the day, randomly, etc.) indicating a state of health of network terminal 120, a state of charge of storage device 310, and/or an indication associated with a current power source.

Transmitter 328 may include one or more devices that transmit a wired and/or wireless signal to network 160. In one example implementation, transmitter 328 may include a laser, which may generate and transmit an optical signal at a particular wavelength and/or with a particular bandwidth. In another example implementation, transmitter 328 may be a device that transmits a wired and/or wireless signal at a particular wavelength and/or bandwidth. Transmitter 328 may receive a signal from processor 326 and may use the received signal to modulate and/or generate another signal at a given wavelength and/or bandwidth to be transmitted to network 160.

FIG. 4 is a diagram of an example outage notification data structure 400 (hereinafter referred to as "data structure 400") according to an implementation described herein. In one example implementation, one or more data structures 400 may be stored in a storage device included as part of memory 330 of NMS 130. For example, a different data structure 400 may be stored for each geographic region with which NMS 130 is associated. In another example implementation, data structure 400 may be stored in a memory associated with another device or a group of devices, separate from or including memory 330 of NMS 130.

As shown in FIG. 4, data structure 400 may include a collection of fields, such as a network terminal identifier (ID) field 405, a location field 410, a notification code field 415, a time field 420, an outage duration field 425, and a status field 430. Although FIG. 4 shows example fields of data structure 400, in other implementations, data structure 400 may contain fewer fields, different fields, additional fields, or differently arranged fields than depicted in FIG. 4. Additionally, or alternatively, one or more fields of data structure 400 may include information described as being included in one or more other fields of data structure 400.

Network terminal ID field 405 may store information associated with a particular network terminal 120 from which an outage alert was received. The information associated with the particular network terminal 120 may include an identifier associated with network terminal 120 (e.g., a coder-decoder (CODEC), an electronic serial number, a network address, etc.). Location field 410 may store information associated with a location of the particular network terminal 120. For example, the O&R application may perform a look-up operation by identifying information associated with network terminal 120 (e.g., stored in a memory associated with NMS 130) that matches information associated with the particular network terminal 120 received in an outage alert. The O&R application may retrieve, from the memory, location information that corresponds to the stored information associated with network terminal 120 and may store the location information in location field 410. The location information may include a physical address, grid coordinates, latitude and/or longitude, etc., associated with a user of STB 110, that is coupled to the particular network terminal 120.

Notification code field 415 may store information (e.g., an alarm code, a string, a value, a label, etc.) associated with a type of alert received from the particular network terminal 120. For example, the O&R application may store an indication that an outage has been detected. In another example, the O&R application may store an indication that power has been restored. In yet another example, the O&R application may store indications associated with a charge state of storage device 310 (FIG. 3). Time field 420 may store a time associated with a point in time that an outage was detected by the particular network terminal 120. In another example, the O&R application may store another point in time when the outage alert was received from the particular network terminal 120. Outage duration field 425 may store a value associated with an elapsed time since the outage was detected (e.g., or that the outage alert was received) by the particular network terminal 120. Status field 430 may store an indication regarding whether the particular network terminal 120 is operating based on battery power, AC power, and/or regarding a battery charge state.

For example, NMS 130 may receive an outage alert from the particular network terminal 120 and the O&R application may store, in data structure 400, information associated with the particular network terminal 120 (e.g., device ID) obtained from the outage alert and a physical address associated with the particular network terminal 120 (e.g., address 1) obtained as a result of a look-up operation (e.g., as shown by ellipse 435). Alternatively, or additionally, the O&R application may store an indication that an outage has been detected (e.g., A1), a point in time that the outage was detected (e.g., Oct. 1, 2010, 11:01:35), an elapsed time since the point in time that the outage was detected (e.g., 00:02:05) and a status associated with the power state and/or charge state of the device (e.g., Battery-Full) (e.g., as shown by ellipse 435).

In another example, NMS 130 may receive a restore alert from the particular network terminal 120 and the O&R application may store, in data structure 400, information associated with the particular network terminal 120 (e.g., a network address) obtained from the restore alert and coordinates (e.g., coordinates x, y) associated with the particular network terminal 120 obtained as a result of another look-up operation (e.g., as shown by ellipse 440). Alternatively, or additionally, the O&R application may store another indication that AC power has been restored (e.g., A2), a point in time that the power was restored (e.g., Oct. 1, 2010, 08:41:38), an elapsed time of the outage (e.g., 02:29:30) and a status associated with the power state and/or charge state of the device (e.g., AC, Battery-medium) (e.g., as shown by ellipse 440).

FIG. 5 is a diagram of an example outage event data structure 500 (hereinafter referred to as "event data structure 500") according to an implementation described herein. In one example implementation, one or more event data structures 500 may be stored in a storage device included as part of memory 330 of NMS 130. In another example implementation, event data structure 500 may be stored in a memory associated with another device or a group of devices, separate from or including memory 330 of NMS 130.

As shown in FIG. 5, event data structure 500 may include a collection of fields, such as an area identifier (ID) field 505, a quantity of outages field 510, an outage threshold field 515, a simultaneous outages field 520, and a co-located outages field 525. Although FIG. 5 shows example fields of event data structure 500, in other implementations, event data structure 500 may contain fewer fields, different fields, additional fields, or differently arranged fields than depicted in FIG. 5. Additionally, or alternatively, one or more fields of event data structure 500 may include information described as being included in one or more other fields of data structure 500.

Area identifier (ID) field 505 may store an identifier associated with a particular geographical area with which network terminals 120 are located. Quantity of outages field 510 may store a quantity of outages associated with the particular geographical area within a period of time. Outage threshold field 515 may store a value that is used by the O&R application to determine whether an outage event, associated with the particular geographical area, is triggered. For example, the outage event for the particular geographical area may be triggered based on a determination that a quantity of the outages is greater than the value. Simultaneous outages field 520 may store a quantity of simultaneous outages associated with a quantity of network terminals 120, within the particular geographical area, that detect an outage at approximately the same time (e.g., within a particular period of time). Co-located outages field 525 may store a quantity of co-located outages associated with a quantity of network terminals 120, within the particular geographical area, that detect an outage at approximately the same location (e.g., within a particular distance, radius, or area).

For example, the O&R application may retrieve a data outage data structure (e.g., data structure 400 of FIG. 4) associated with a particular geographic area (e.g., A1) and may determine a quantity of outages (e.g., A1-X) detected by network terminals 120 that are located within the particular geographical area (e.g., as shown by ellipse 530). The quantity of outages may determine from a prior point in time to a current time. The O&R application may, for example, identify a quantity of simultaneous outages (e.g., A1-Y) within the particular geographical area based on whether the outages were detected at approximately the same time (e.g., from time field 420 of FIG. 4) (e.g., as shown by ellipse 530). The O&R application may, in another example, identify a quantity of co-located outages (e.g., A1-Z) within the particular geographical area based on whether the outages were detected at approximately the same location (e.g., from location field 410 of FIG. 4) (e.g., as shown by ellipse 530).

The O&R application may use event data structure 500 to determine whether an outage event has been triggered. For example, the O&R application may compare the quantity of outages (e.g., A1-X) with an outage threshold (e.g., THA1) to determine whether the quantity of outages is greater than the outage threshold. Based on a determination that the quantity of outages is greater than the outage threshold, the O&R application may send an outage event notification to O&RS 140 alerting a power provider (e.g., associated with O&RS 140) that an outage event has been triggered. In another example, the O&R application may compare the quantity of simultaneous outages (e.g., A1-Y) to a simultaneous threshold to determine whether an outage event has been triggered. In yet another example, the O&R application may compare a quantity of co-located outages (e.g., A1-Z) to a co-located threshold to determine whether an outage event has been triggered. Based on a determination that an outage event has been triggered (e.g., when the quantity of simultaneous outages is greater than the simultaneous threshold or when the quantity of co-located outages is greater than the co-located threshold), the O&R application may send the event outage notification.

The O&R application may store outage information, in event data structure 500, that was obtained and/or processed from other outage data structures (e.g., data structures 400) associated with other geographic areas within which other network terminals 120 are located (e.g., as shown by ellipse 535). The O&R application may use the outage information from one or more geographical areas (e.g., as shown by ellipses 530, 535, etc.) to generate total outage information for storage in event data structure 500 (e.g., as shown by ellipse 540). The O&R application may use the total outage information to determine whether an outage event is triggered in a manner similar to that described above and may send an outage event notification to O&RS 140 based on a determination that an outage event has been triggered.

Figure 6:
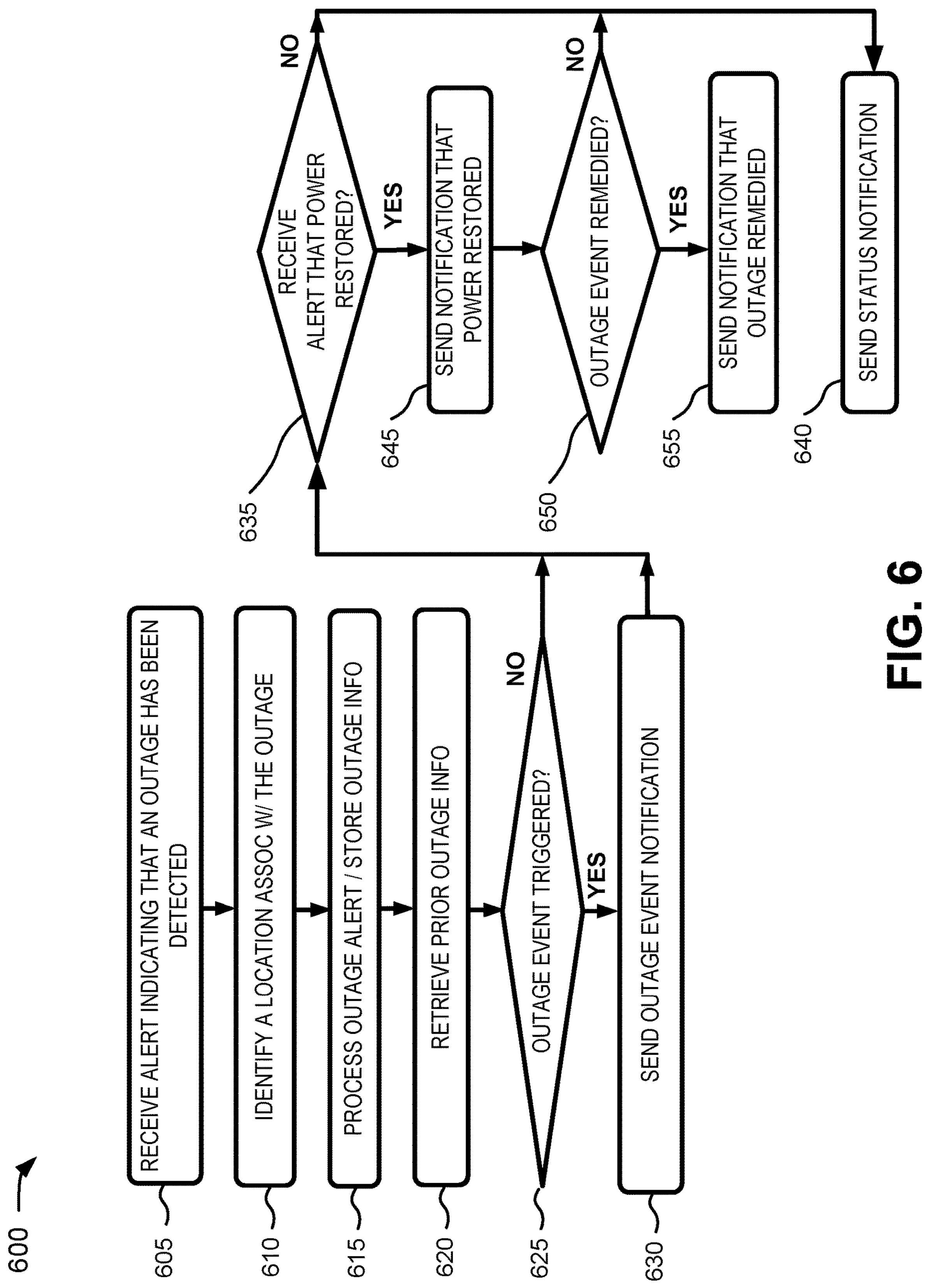
FIG. 6 is a flowchart of an example process for detecting and managing an outage and/or outage event according to an implementation described herein.

FIG. 6 is a flowchart of an example process 600 for detecting and notifying an outage/restoration and/or outage/restoration event according to an implementation described herein. In one example implementation, process 600 may be performed by O&RS 140. In another implementation, some or all of process 600 may be performed by a device or collection of devices separate from, or in combination with, O&RS 140—for example NMS 130.

As shown in FIG. 6, process 600 may include receiving an alert that an outage has been detected (block 605). For example, network terminal 120 may detect an outage when AC power is no longer being received. Based on the detection of the outage, network terminal 120 may switch power sources from the AC power to storage device 310. Network terminal 120 may generate an outage alert and may send the outage alert to NMS 130. The outage alert may include information associated with network terminal 120 (e.g., a device identifier, a network address, etc.), an indication that an outage has been detected, a time that the outage was detected, a charge state associated with storage device 310, and/or an indication that network terminal 120 is operating on stored power. NMS 130 may receive the outage alert.

As also shown in FIG. 6, process 600 may include identifying a location associated with the outage (block 610). For example, the O&R application, hosted by NMS 130, may perform a look-up operation by comparing the information associated with network terminal 120 received in the outage alert to information associated with network terminals 120 stored in a memory associated with NMS 130. The O&R application may identify information associated with network terminal 120 stored in the memory that matches the received information associated with network terminal 120 and may retrieve, from the memory, location information associated network terminal 120 that corresponds with the stored information associated with network terminal 120. The location information may, for example, include a physical address associated with a user of STB 110 that is coupled to network terminal 120. In another example, the location information may include coordinates (e.g., grid coordinates, latitude and/or longitude, etc.) associated with network terminal 120.

As further shown in FIG. 6, process 600 may include processing an outage alert and/or storing outage information (block 615). For example, the O&R application may store outage information associated with network terminal 120 in an outage data structure (e.g., data structure 400 of FIG. 4). The outage information may include the information associated with network terminal 120, the location information based on the look-up operation, the indication that an outage has been detected, a time associated with the outage (e.g., a time that the outage was detected and/or that the outage alert was received), an elapsed time since the time associated with the outage, and/or a status regarding a power source on which the network terminal 120 is operating and/or a charge state of storage device 310. Based on the receipt of the outage alert, the O&R application may, for example, send an outage notification associated with network terminal 120 to O&RS 140 that includes all or a portion of the outage information stored in the outage data structure. In another example, the O&R application may send a status message (e.g., periodically, randomly, upon the occurrence of some event, etc.), at a later point in time that includes all or a portion of the outage information. In yet another example, the O&R application may send a status and/or the outage notification when a quantity of outage alerts, received from network terminal 120 and/or other network terminals 120, is greater than a threshold.

As yet further shown in FIG. 6, process 600 may include retrieving prior outage information (block 620). For example, the O&R application may retrieve, from a memory associated with O&RS 140, outage information from a prior point in time associated with network terminals 120 (hereinafter referred to as outage event information) within one or more geographic regions within which network terminals 120 are located. In one example, the outage event information may be obtained from an outage event data structure (e.g., event data structure 500 of FIG. 5). The outage event information may include information associated with a geographic area (e.g., an area ID) from which prior outages have been detected, a quantity of outages associated with the geographical area, an outage threshold, a quantity of simultaneous outages within the geographic area, a quantity of co-located outages in the geographic area, and/or other outage event information (e.g., such as outage trends, etc.). The prior outages may, for example, be associated with outages that occurred within a particular period of time (e.g., 5 minutes, 30 minutes, one hour, two hours, 12 hours, etc.).

As also shown in FIG. 6, if an outage event is triggered (block 625—YES), then process 600 may include sending an outage event notification (block 630). For example, the O&R application may determine that an outage event, associated with the geographic area has occurred when the quantity of outages is greater than the outage threshold. In another example, the O&R application may determine that an outage event has occurred when a pattern of outages are detected, such as a quantity of simultaneous outages (e.g., greater than a simultaneous threshold), co-located outages (e.g., an outage that occurs at a distance and/or area that is less than a location threshold relative to another outage). In this example, the O&R application may detect the outage event when a quantity of simultaneous outages (and/or co-located outages) were detected that correspond to the quantity of network terminals 120 located on a particular street, connected to a particular substation, etc. The O&R application may use the event outage information to identify and/or isolate potential fault locations associated with the outages. Based on the determination that an outage event has occurred, the O&R application may send an outage event notification to O&RS 140. The outage event notification may include outage information associated with an outage notification associated with network terminal 120, the outage event information, and/or information associated with fault isolation (e.g., potential fault locations, etc.).

In another example, the outage event notification may include information associated with a user interface via which mapping information associated with the geographic area may be presented for display. Alternatively, or additionally, location information associated with network terminal 120, other network terminals 120 with which power outages are associated, information associated with the power grid, etc. may be included for display via the UI.

The O&R application may identify an outage event that triggers an emergency management protocol and/or response when a quantity of outages is greater than an emergency threshold (e.g., an emergency threshold that is greater than the outage threshold) that may correspond to particularly wide spread outages. The O&R application may send an emergency outage event alert to O&RS 140 and/or information server 150 (e.g., associated with local, state, federal governmental authorities and/or first responders.).

The O&R application may determine that an outage event has occurred, or will occur at a future point in time, based on outage trends, such as when a quantity of outages within a period of time is increasing. The outage event may, for example, be identified when a rate of increase in the quantity of outages is greater than a threshold. In another example, an outage event may be identified when the quantity of outages is increasing in a manner that the O&R application may project that the quantity of outages may be greater than the outage threshold within a future period of time. Based on the determination that an outage event has been identified based on the outage trends, the O&R application may send an outage event notification to O&RS 140. The outage notification may include outage information associated with an outage alert associated with network terminal 120, the outage event information, location information associated with each outage, information associated with outage trends, and/or a future period of time during which the quantity of outages is projected to be greater than the outage threshold.

In yet another example, the O&R application may determine that an outage event may occur at a future point in time based on weather conditions. For example, the O&R application may communicate with information server 150 to obtain weather information, which may include weather forecasts, weather warnings, information associated with natural disasters, etc. The O&R application may use event outage information (e.g., obtained from the memory) from a prior period of time that associated with a type of weather information (e.g., a heat wave, a cold spell, storm conditions, high winds, etc.) that corresponds to the weather information obtained from information server 150. For example, the O&R application may identify that during the prior period of time, a particular quantity of outages were detected that is greater than the outage threshold. In another example, the O&R application may identify that particular locations and/or portions of the power grid that may be susceptible to outages based on a quantity of outages and/or locations of the outages during the prior period of time. Based on the event outage information from a prior period of time that corresponds to the type of weather information, the O&R application may send an outage event notification which may indicate that an outage event is forecasted to occur, particular portions of the power grid that may be susceptible, projected quantities and/or locations of outages, etc.

In still another example, the O&R application may determine that an outage event may occur based on conditions present on a power grid. For example, the O&R application may communicate with O&RS 140 and/or information server 150 to obtain information associated with conditions on the power grid and/or conditions that may affect the power grid. The conditions may include load imbalances within the power grid, peak periods of power consumption, brown-outs, blackouts, malfunctioning equipment, etc. The O&R application may use event outage information (e.g., obtained from the memory) from a prior period of time that is associated with a type of conditions that corresponds to the information associated with the conditions obtained from O&RS 140 and/or information server 150. For example, the O&R application may identify that during the prior period of time, a particular quantity of outages were detected that is greater than the outage threshold. In another example, the O&R application may identify that particular locations and/or portions of the power grid that are potentially susceptible to outages based on the conditions present on the power grid at the prior period of time. Based on the event outage information from a prior period of time that corresponds to the information associated with the conditions on the power grid, the O&R application may send an outage event notification which may indicate that an outage event is forecasted to occur, particular portions of the power grid that may be susceptible, projected quantities and/or locations of outages, etc.

As yet further shown in FIG. 6, if an outage event is not triggered (block 625—NO), or after sending out the outage event notification (block 630), and if a notification that power is restored is not received (block 635—NO), then process 600 may include sending a status notification (block 640). For example, the O&R application may determine that an outage event, associated with a geographic area, is not triggered when a quantity of outages is less than the outage threshold. In another example, the O&R application may determine that an outage event is not triggered when a pattern of outages are not detected, based on a quantity of simultaneous outages (e.g., less than the simultaneous threshold) and/or co-located outages (e.g., an outage that occurs at a distance and/or area that is greater than the location threshold relative to another outage).

In another example, the O&R application may determine that an outage event is not triggered based on outage trends, such as when a quantity of outages, within a period of time, is not increasing in a manner that triggers an outage event. For example, the O&R application may not detect an outage event when a rate of increase in the quantity of outages is less than a threshold. In another example, the O&R application may not detect an outage event when the quantity of outages is not increasing in a manner that the O&R application projects that the quantity of outages are expected to be greater than the outage threshold within a future period of time.

In yet another example, the O&R application may determine that an outage event is not projected to occur at a future point in time based on weather information. For example, the O&R application may use event outage information from a prior period of time that is associated with a type of weather information obtained from information server 150. For example, the O&R application may determine that during the prior period of time, a quantity of outages were less than the outage threshold. In still another example, the O&R application may determine that an outage event is not expected to occur based on conditions present on a power grid. For example, the O&R application may identify that during the prior period of time, a quantity of outages were not greater than the outage threshold. In another example, the O&R application may identify that particular locations and/or portions of the power grid that are not susceptible to outages based on the conditions present on the power grid at the prior period of time.

Additionally, or alternatively, the O&R application may not receive a restore alert from network terminal 120. For example, network terminal 120 may monitor whether AC power is being received from the power grid (via an AC power outlet) and may determine that AC power has not been restored. Based on the determination that power has not been restored, network terminal 120 may send an alert that indicates that the AC power has not been restored. The alert may include information associated with network terminal 120, a time when the outage was detected, an elapsed time associated with the outage, a charge state associated with storage device 310 (FIG. 3), and/or other outage information. In another example implementation, network terminal 120 may determine that AC power has not been restored and may not send an alert.

Based on the determination that the AC power has not been restored to network terminal 120, the O&R application may send a status notification, to O&RS 140, when the outage event is detected, in a manner similar to that described above (e.g., with respect to block 625—YES), or after an outage event notification is sent to O&RS 140 in a manner similar to that described above (e.g., with respect to block 630). The status notification may indicate that AC power has not been restored to network terminal 120. Additionally, or alternatively, the status notification may indicate an elapsed time of the outage and/or other outage information associated with network terminal 120.

As further shown in FIG. 6, if an outage event is not triggered (block 625—NO), or after sending out the outage event notification (block 630), and if a notification that power is restored is received (block 635—YES), then process 600 may include sending a notification that power is restored (block 645). For example, the O&R application may receive a restore alert from network terminal 120. For example, network terminal 120 may, monitor whether AC power is being received from the power grid (e.g., via an AC power outlet) and may determine that AC power has been restored. Based on the determination that AC power has been restored, network terminal 120 may switch from receiving power from storage device 310 (FIG. 3) to the AC power source. Alternatively, or additionally, network terminal 120 may send a restore alert that indicates that the AC power has been restored. The restore alert may include information associated with network terminal 120, a charge state associated with storage device 310, a time when the AC power was restored, an elapsed time associated with the outage, and/or other outage information. In another example implementation, network terminal 120 may determine that AC power has been restored and may not send a restore alert.

Based on the determination that the AC power has been restored to network terminal 120, the O&R application may send a restore notification, to O&RS 140, when the outage event is detected, in a manner similar to that described above (e.g., with respect to block 625—YES), or after an outage event notification is sent to O&RS 140 in a manner similar to that described above (e.g., with respect to block 630). The restore notification may indicate that AC power has not been restored to network terminal 120. Additionally, or alternatively, the status notification may indicate an elapsed time of the outage and/or other outage information associated with network terminal 120.

As yet further shown in FIG. 6, if the outage event is not remedied (block 650—NO), then process 600 may include sending a status notification (block 640). For example, the O&R application may retrieve information from an outage event data structure (e.g., from event data structure 500 of FIG. 5) from a prior period of time. Based on the quantity of outages obtained from the outage event data structure, the O&R application may determine that the quantity of outages is greater than the outages threshold and/or that quantity of outages is increasing at a rate that corresponds to an outage event. In yet another example, the O&R application may determine that weather information and/or information associated with conditions on the power grid indicate that the outage event still exists on the power grid. For example, the weather information may indicate that weather conditions have not improved (e.g., a heat wave or cold spell has not subsided, storm conditions have not dissipated, etc.), which may cause the O&R application to determine that an outage event exists. In another example, the information associated with conditions on the power grid may indicate that conditions have not improved, which may cause the O&R application to determine that an outage event is present on the power grid. Based on the determination that the outage event is present on the power grid, the O&R application may send a status notification, to O&RS 140, in a manner similar to that described above (e.g., with respect to block 635—NO).

As still further shown in FIG. 6, if the outage event is remedied (block 650—YES), then process 600 may include sending a notification that the outage is remedied (block 655). For example, the O&R application may receive the restore alert from network terminal 120 and/or other restore alerts associated with other network terminals 120 and may retrieve information from an outage event data structure (e.g., from event data structure 500 of FIG. 5) from a prior period of time. Based on the restore alert and/or a quantity of outages obtained from the outage event data structure, the O&R application may determine that the quantity of outages is not greater than the outages threshold. In another example, the O&R application may determine that a trend, associated with the quantity of outages, is not increasing at a rate that corresponds to an outage event. In yet another example, the O&R application may determine that, based on a decreasing quantity of outages, the outage event has been remedied and/or that the outage event may be remedied at a future point in time.

In still another example, the O&R application may determine that weather information and/or information associated with conditions on the power grid have changed, such that the outage event is no longer present. For example, the weather information may indicate that weather conditions have improved (e.g., a heat wave or cold spell has subsided, storm conditions have not materialized or have passed, etc.), which may cause the O&R application to no longer project that an outage event has occurred or is projected to occur. In another example, the information associated with conditions on the power grid have improved (e.g., a load balancing operation was performed, consumption decreased, repairs to equipment were made, etc.), which may cause the O&R application to no longer project that an outage event has occurred or is projected to occur. Based on a determination that an outage event has been remedied and/or is not longer projected to occur, the O&R application may send, to O&RS 140, a notification that the outage event has been remedied.

An implementation, described herein, may provide for remote power outage detection and notification. An O&R application may receive an outage alert from a network terminal 120, which indicates that an outage has been detected on a power grid from which the network terminal 120 receives power. Based on the detection of the outage, the O&R application may send an outage notification to an O&RS 140, associated with a power provider, which may enable the power provider perform operations to remedy the outage. The O&R application may retrieve outage information, from a prior period of time, to determine whether an outage event is detected. The O&R application may compare a quantity of outages, obtained from the outage information and associated with network terminals 120 within a geographic area, to an outage threshold to determine whether an outage event is detected. Based on a determination that the quantity of outages is greater than the outage threshold, the O&R application may send a notification to the O&RS 140, which indicates that an outage event has been detected on all or a portion of the power grid. The O&RS 140 may receive the notification and may perform operations to mitigate and/or remedy the outage event.

The foregoing description provides illustration and description, but is not intended to be exhaustive or to limit the invention to the precise form disclosed. Modifications and variations are possible in light of the above teachings or may be acquired from practice of the invention.

While series of blocks have been described, with regard to FIG. 6, the order of the blocks may be modified in other implementations. Further, non-dependent blocks may be performed in parallel.

It will be apparent that systems and methods, as described above, may be implemented in many different forms of software, firmware, and hardware in the implementations illustrated in the figures. The actual software code or specialized control hardware used to implement these systems and methods is not limiting of the invention. Thus, the operation and behavior of the systems and methods were described without reference to the specific software code—it being understood that software and control hardware can be designed to implement the systems and methods based on the description herein.

Further, certain portions, described above, may be implemented as a component or logic that performs one or more functions. A component or logic, as used herein, may include hardware, such as a processor, an ASIC, or a FPGA, or a combination of hardware and software (e.g., a processor that executes software).

It should be emphasized that the terms "comprises"/"comprising," when used in this specification, are taken to specify the presence of stated features, integers, steps or components but does not preclude the presence or addition of one or more other features, integers, steps, components or groups thereof.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method, comprising:

receiving, from a plurality of network devices located at a plurality of customer premises, a plurality of alerts, wherein each alert indicates that one of the plurality of network devices lost primary power;

determining, based on the received plurality of alerts, whether a power outage has occurred based on at least one of:

whether a first quantity of the plurality of alerts occurred within a predetermined period of time of each other, or whether receiving the plurality of alerts is increasing at a rate greater than a first threshold, wherein the rate is based on a second quantity of the plurality of network devices that have lost primary power at a present point in time and a third quantity of the plurality of network devices that have lost primary power at a prior point in time; and generating a power outage indication in response to the determining that the power outage has occurred.

2. The method of claim 1, wherein the receiving the plurality of alerts comprises receiving at least one of a network device identifier or a network address with each alert.

3. The method of claim 2, further comprising:

recording a time associated with each of the plurality of alerts; and generating location information based on the network device identifier or network address for each of the plurality of alerts.

4. The method of claim 1, wherein the receiving the plurality of alerts comprises:

receiving, from at least some of the plurality of network devices, an indication that the network device is operating using battery power.

5. The method of claim 1, further comprising:

determining that a fourth quantity of the plurality of alerts is greater than a second threshold; and generating a second power outage indication in response to determining that the fourth quantity of the plurality of alerts is greater than the second threshold.

6. The method of claim 1, wherein the determining that the power outage occurred comprises:

determining that the first quantity of the plurality of alerts occurred within the predetermined period of time of each other.

7. The method of claim 1, further comprising:

determining that a fourth quantity of the plurality of alerts occurred within the geographical area or within a predetermined distance of each other.

8. The method of claim 1, wherein the determining that the power outage occurred comprises:

determining that the receiving the plurality of alerts is increasing at the rate greater than the first threshold.

9. The method of claim 1, wherein each of the plurality of network devices is configured to receive data traffic and media traffic for one of the plurality of customer premises.

10. The method of claim 1, further comprising:

notifying a power provider associated with providing power to the plurality of customer premises that the power outage has occurred.

11. The method of claim 1, further comprising:

receiving, from at least some of the plurality of network devices, a second alert, wherein each second alert indicates that one of the plurality of network devices has regained primary power; and determining, based on the plurality of second alerts, whether the power outage has been remedied.

12. The method of claim 11, further comprising:

notifying a power provider associated with providing power to the plurality of customer premises that the power outage has been remedied.

13. A device, comprising:

a memory to store information associated with power outages; and a processor configured to:

receive, from a plurality of network devices located at a plurality of customer premises, a plurality of alerts, wherein each alert indicates that one of the plurality of network devices lost primary power;

determine, based on the received plurality of alerts, whether a power outage has occurred based on at least one of:

whether a first quantity of the plurality of alerts occurred within a predetermined period of time of each other, or whether receiving the plurality of alerts is increasing at a rate greater than a first threshold, wherein the rate is based on a second quantity of the plurality of network devices that have lost primary power at a present point in time and a third quantity of the plurality of network devices that have lost primary power at a prior point in time; and generate a power outage indication in response to the determining that the power outage has occurred.

14. The device of claim 13, wherein each alert comprises a network device identifier or a network address, and wherein the processor is further configured to:

store, in the memory, a time associated with each of the plurality of alerts, generate location information based on the network device identifier or network address for each of the plurality of alerts, and store the location information in the memory.

15. The device of claim 13, wherein the receiving the plurality of alerts comprises:

receiving, from at least some of the plurality of network devices, an indication that the network device is operating using battery power.

16. The device of claim 13, wherein the processor is further configured to:

generate a notification for a power provider associated with providing power to the plurality of customer premises indicating that the power outage has occurred.

17. The device of claim 13, wherein the processor is further configured to:

receive, from at least some of the plurality of network devices, a second alert, wherein each second alert indicates that one of the plurality of network devices has regained primary power; and determine, based on the plurality of second alerts, whether the power outage has been remedied.

18. The device of claim 17, wherein the processor is further configured to:

transmit a notification to a power provider associated with providing power to the plurality of customer premises, in response to determining that the power outage has been remedied.

19. A system, comprising:

a plurality of first network devices located at a plurality of customer premises, wherein each of the plurality of first network devices is configured to:

detect loss of primary power to the first network device, and send an alert in response to detecting the loss of primary power; and a second network device configured to:

receive, from the first plurality of network devices, a plurality of alerts, wherein each alert indicates that one of the first plurality of network devices detected loss of primary power, determine, based on the received plurality of alerts, whether a power outage has occurred based on at least one of:

whether a first quantity of the plurality of alerts occurred within a predetermined period of time of each other, or whether receiving the plurality of alerts is increasing at a rate greater than a first threshold, wherein the rate is based on a second quantity of the plurality of first network devices that have lost primary power at a present point in time and a third quantity of the plurality of first network devices that have lost primary power at a prior point in time; and generate a power outage indication in response to the determining that the power outage has occurred.

20. The system of claim 19, wherein the plurality of first network terminals comprise network terminals configured to receive data traffic and media traffic for one of the plurality of customer premises.

* * * * *